(12) United States Patent
Nishioka

(10) Patent No.: US 6,385,105 B2
(45) Date of Patent: May 7, 2002

(54) SEMICONDUCTOR MEMORY AND METHOD OF SAVING ENERGY OF THE MEMORY

(75) Inventor: Naohisa Nishioka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/819,352

(22) Filed: Mar. 28, 2001

(30) Foreign Application Priority Data

Mar. 30, 2000 (JP) ......................................... 2000-092671

(51) Int. Cl.[7] ................................................. G11C 7/00
(52) U.S. Cl. ......................................... 365/202; 365/203
(58) Field of Search ................................ 365/190, 202, 365/203, 227, 230.03

(56) References Cited

U.S. PATENT DOCUMENTS 5,369,620 A * 11/1994 Sugibayashi ........... 365/230.03
5,701,268 A * 12/1997 Lee et al. .................... 365/205
5,875,139 A * 2/1999 Semi ........................... 365/203
5,903,502 A * 5/1999 Porter ......................... 365/201
6,023,437 A * 2/2000 Lee ............................. 365/203
6,069,828 A * 5/2000 Kaneko et al. .......... 365/189.09

* cited by examiner

Primary Examiner—Son Mai
(74) Attorney, Agent, or Firm—Scully, Scott, Murphy & Presser

(57) ABSTRACT

In an array of memory cells, multiple prechargers are respectively connected to bit-line pairs of the array. Near-end balancers and far-end balancers are connected to opposite ends of the bit-line pairs. During a read mode of the memory, the prechargers and both near-end and far-end balancers are activated. For power savings purposes, during a write mode the prechargers and the far-end balancers remain inactive and the near-end balancers are activated.

6 Claims, 5 Drawing Sheets

US 6,385,105 B2

SEMICONDUCTOR MEMORY AND METHOD OF SAVING ENERGY OF THE MEMORY

BACKGROUND OF THE INVENTION

1. Field of the Invention

The present invention relates generally to semiconductor memories such as dynamic or static random across memories, and more specifically to a power saving semiconductor memory and a method of saving the energy consumption of a semiconductor memory.

2. Description of the Related Art

In a prior art semiconductor memory, shown in FIG. 1, a plurality of bit-line pairs 5 are provided on a memory cell array 1 extending from a near side of the array to a far side of the array with respect to write and read amplifiers 8 and 9. Memory cells of the array are connected to associated bit-line pairs. For high speed operation of the memory, a near-end balancer $2_i$ (where i=1, ..., N) is connected to the near end of a corresponding bit-line pair (or I/O bus) 5 and a far-end balancer $3_i$ is connected to the far end of the corresponding bit-line pair. A plurality of such near-end balancers 2 are respectively connected to prechargers $4_i$. A clock source 6 supplies clock pulses to a control driver 7 which in turn drives both far-end balancers 2 and near-end balancers 3. During a write mode (FIG. 2), data is amplified by the write amplifiers 8 and write clock pulses are supplied to the near-end and far-end balancers 2 and 3 through the control driver 7. When a write clock pulse is low, all bit lines of the memory cells are pre-charged and voltages developed on the bit lines of each pair are balanced with each other by the associated near-end balancer 2 and far-end balancer 3. When the write clock pulse raises to high level, the outputs of the write amplifiers 8 are sent to all bit lines, amplified by sense amplifiers on the cell array and then stored into memory cells that are selected. When the write clock pulse goes low again, the process is repeated for the next cycle of pre-charging and balancing write operation. In a similar manner, read clock pulses are supplied during a read mode to the near-end and far-end balancers 2 and 3 through the control driver 7 so that, when a read clock pulse is low, all bit lines of the memory cells are pre-charged and balanced by all balancers. When the read clock pulse raises to high level, memory cells are selected and data stored in the selected memory cells are read out onto the associated bit-line pairs and amplified by sense amplifiers on the array. The amplified data are extracted from the memory cell array 1 and applied to the read amplifiers 9 associated with the selected memory cells for amplification. When the read clock pulse goes low again, the process is repeated for the next cycle of pre-charging and balancing read operation.

However, the pre-charging and balancing operation are performed during both read and write modes, the consumption of energy is significant and hence it is desired to provide a memory cell array that can operate with less energy.

SUMMARY OF THE INVENTION

It is therefore an object of the present invention to provide a semiconductor memory that can save energy.

According to one aspect, the present invention provides a semiconductor memory comprising an array of memory cells, a plurality of bit-line pairs to which the memory cells of the array are connected, and a plurality of prechargers respectively connected to the bit-line pairs. The prechargers are active during a read mode of the memory and remain inactive during a write mode of the memory.

The semiconductor memory may include a first plurality of balancers connected respectively to first ends of the bit-line pairs and a second plurality of balancers connected respectively to second, opposite ends of the bit-line pairs. The first plurality balancers are active during the read and write modes and the second plurality of balancers are active during the read mode and remain inactive during the write mode. Each of the prechargers may further include a balancing transistor connected across the bit lines of a corresponding pair, the balancing transistor being active at least during the write mode.

BRIEF DESCRIPTION OF THE DRAWINGS

The present invention will be described in detail further with reference to the following drawings, in which.

DETAILED DESCRIPTION

Figure 1:
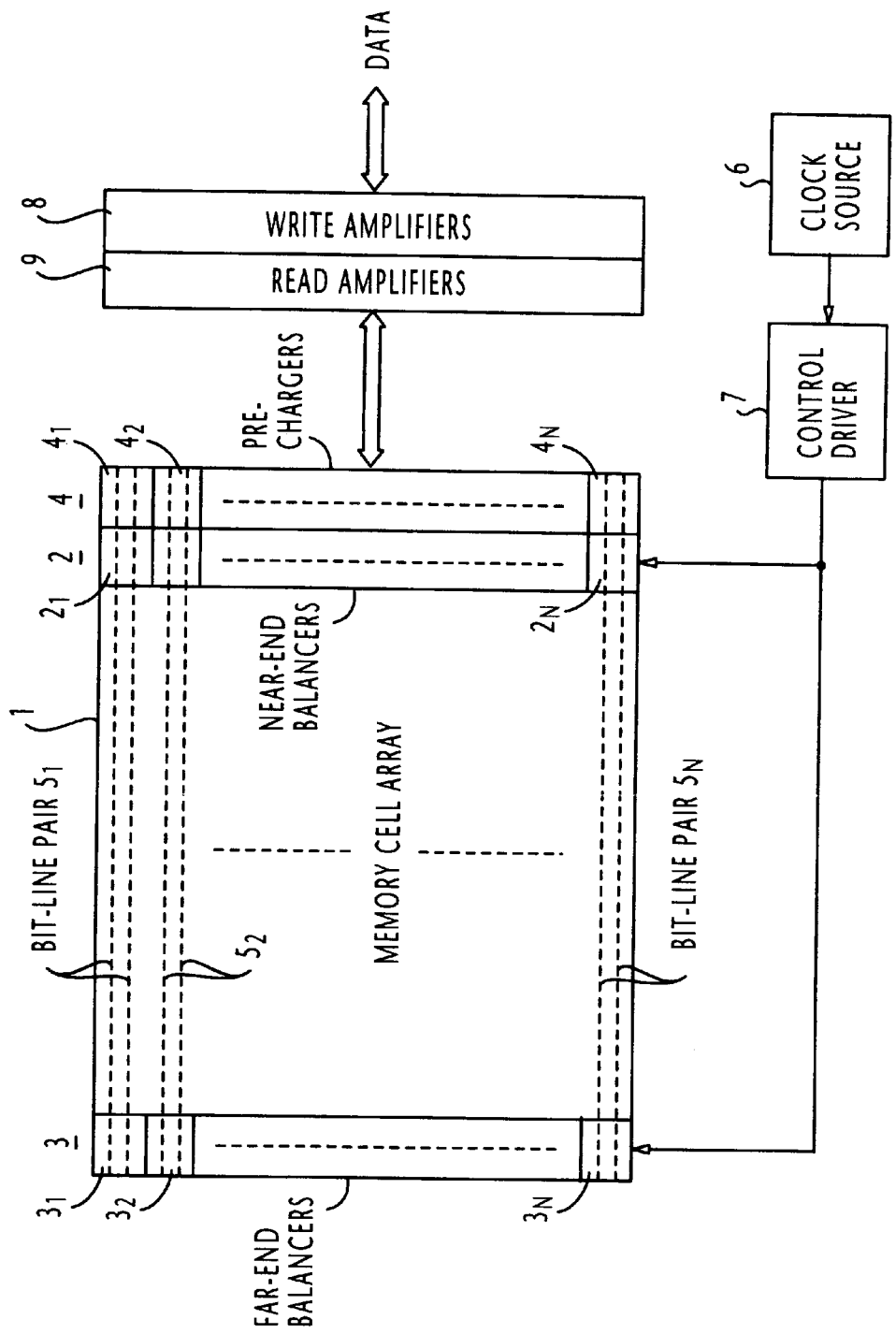
FIG. 1 is a block diagram of a prior art semiconductor memory.
Figure 2:
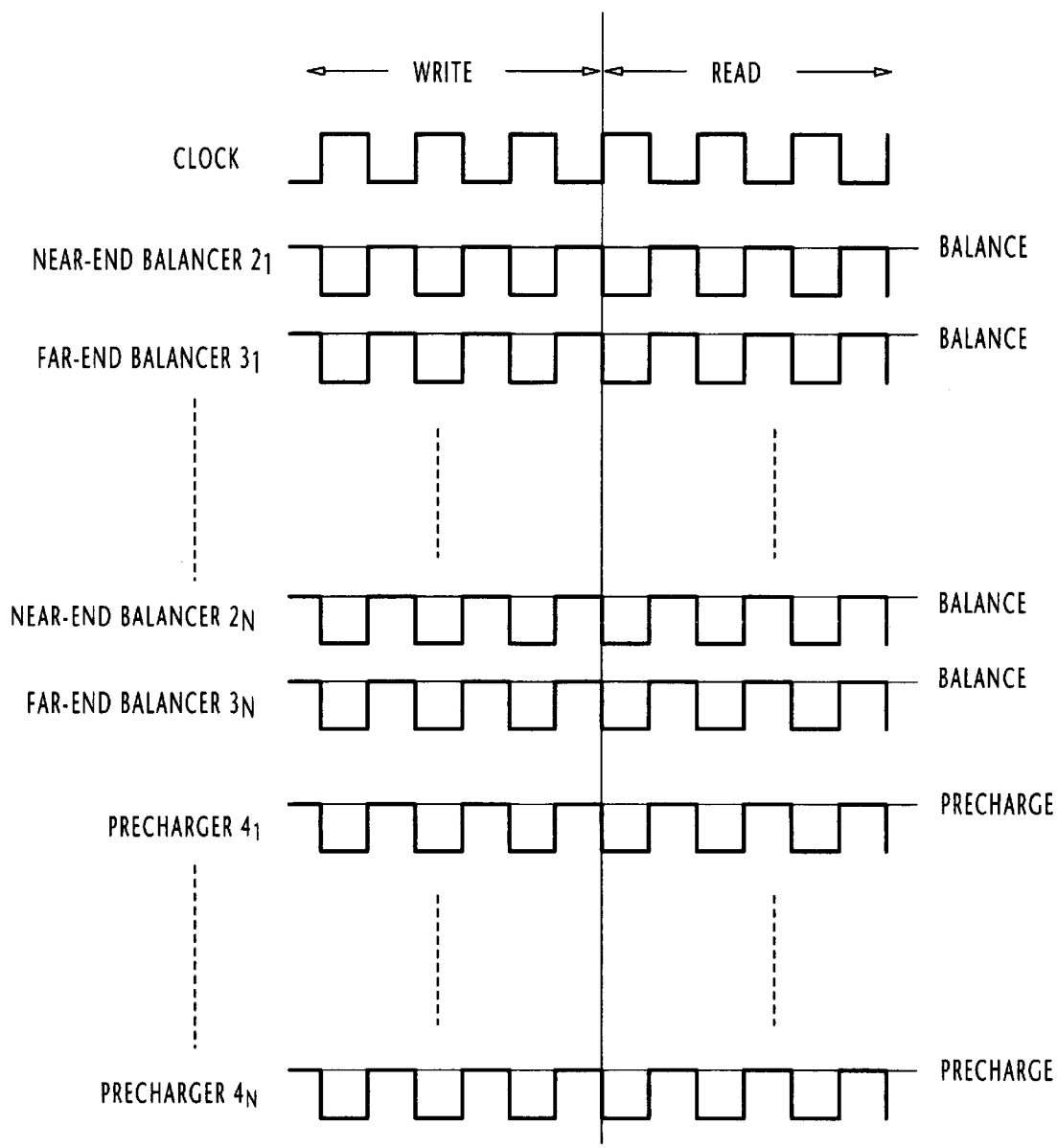
FIG. 2 is a timing diagram of the prior art semiconductor memory.
Figure 3:
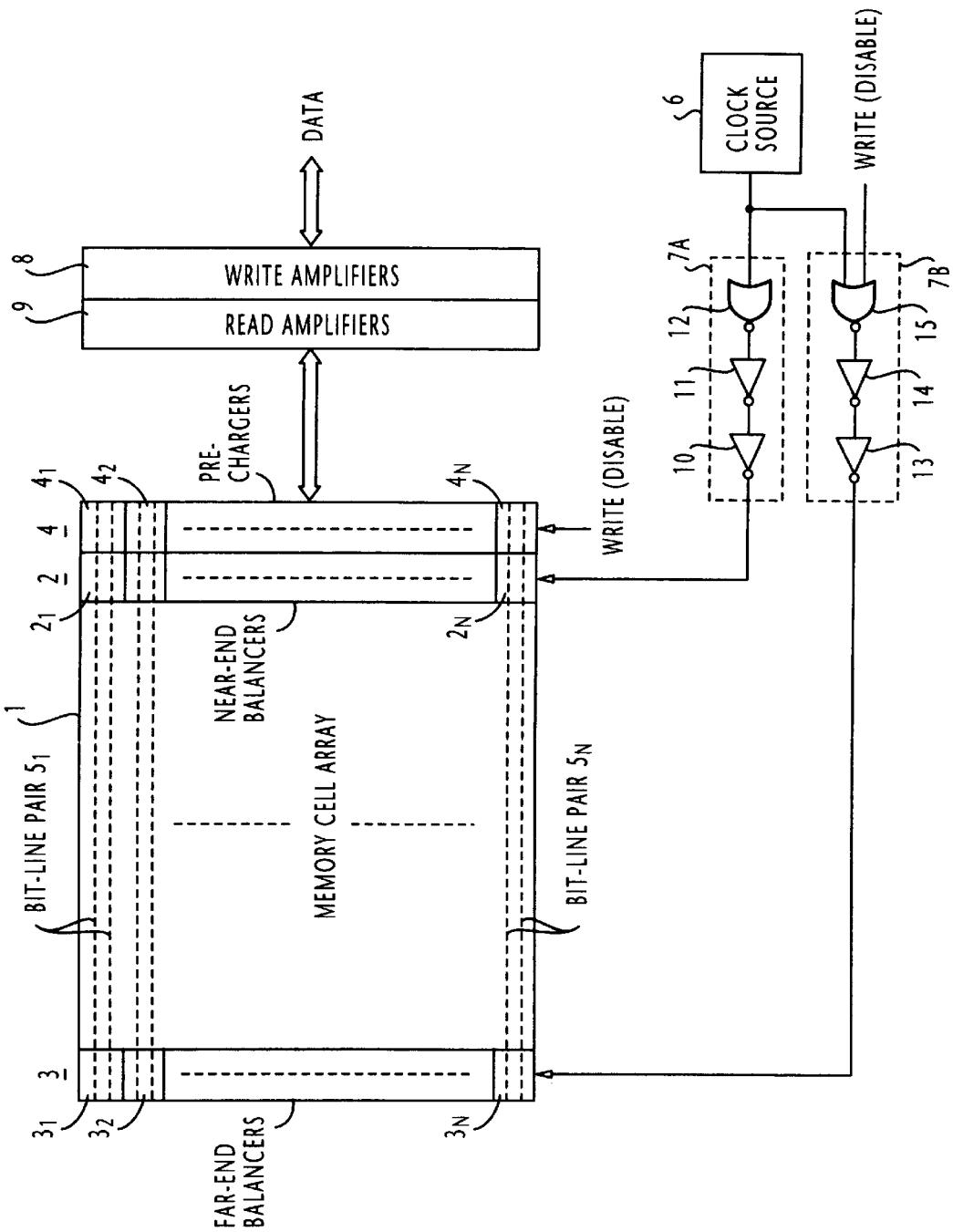
FIG. 3 is a block diagram of a semiconductor memory of the present invention.
Figure 4:
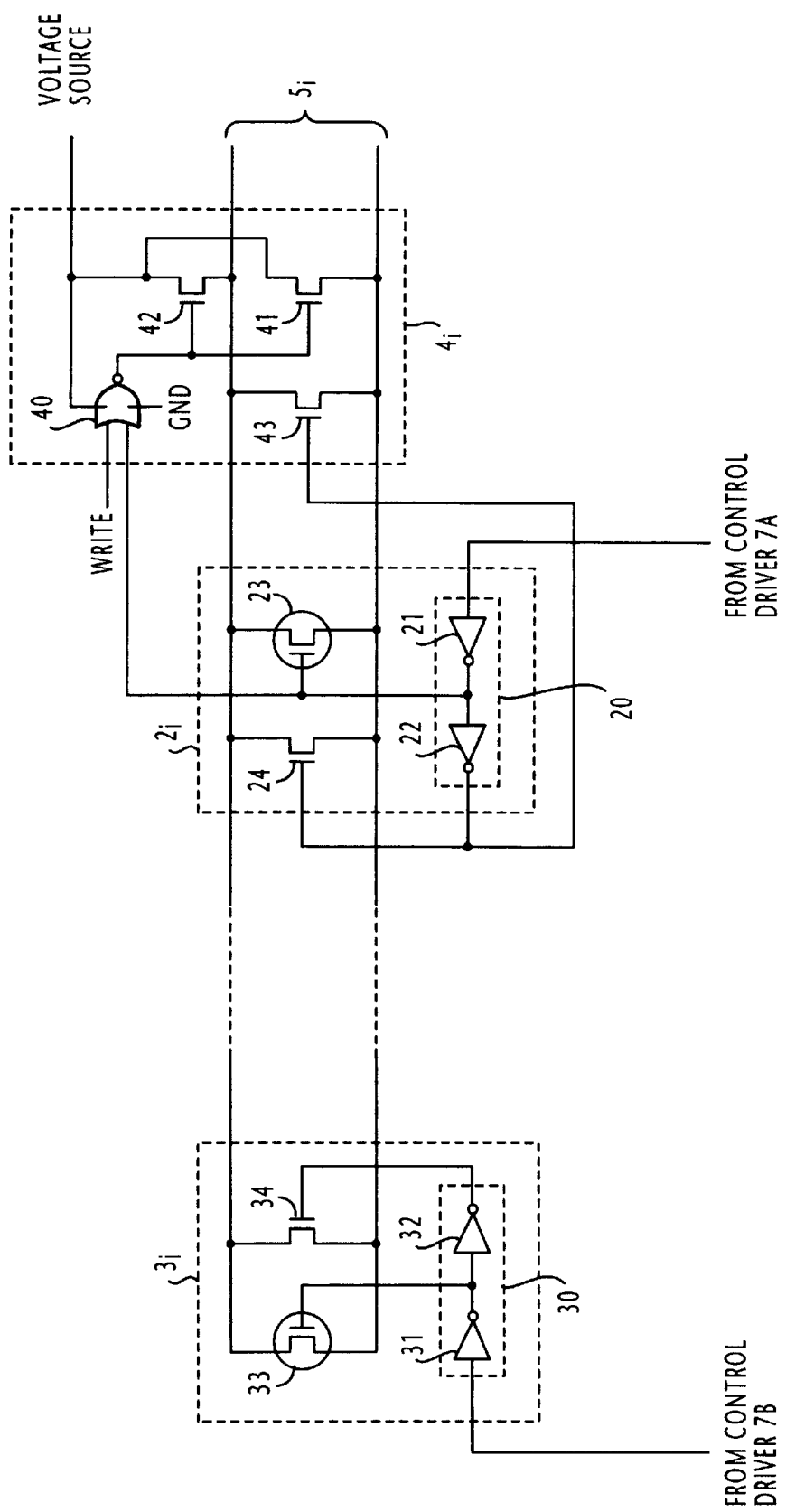
FIG. 4 is a circuit diagram illustrating details of a portion of the memory of FIG. 3 associated with a given bit-line pair.

Referring to FIGS. 3 and 4, a semiconductor memory of the present invention is illustrated. Power saving of the memory is achieved by disabling the far-end balancers 3 and the prechargers 4 during the write mode of memory operation. For the power savings purpose, control drivers 7A and 7B of identical configuration are provided for driving the near-end balancers 2 and far-end balancers 3, respectively. Control driver 7A includes a pair of cascaded inverters 10, 11 and a NOR gate 12, and the control driver 7B includes a pair of cascaded inverters 13, 14 and a NOR gate 15. Clock pulses from the clock source 6 are supplied through the control driver 7A to the near-end balancers 2 during both write and read modes, whereas the clock pulses of source 6 are supplied through the control driver 7B to the far-end balancers 3 only during the read mode by enabling the NOR gate 15. During the write mode, a write pulse (logical 1) is supplied to the control driver 7B to disable the NOR gate 15 to prevent clock pulses from being supplied to all far-end balancers $3_i$–$3_N$. Accordingly, all far-end balancers 3 remain inactive during the write mode, while all near-end balancers 2 are activated for balancing operation (see FIG. 5).

Details of a near-end balancer $2_i$, a far-end balancer $3_i$ and a precharger $4_i$ associated with a bit-line pair $5_i$ are shown in FIG. 4.

Near-end balancer $2_i$ includes a driver 20 formed with a pair of cascaded inverters 21, 22, and a P-channel field-effect transistor 23 and an N-channel field-effect transistor 24. The source and drain terminals of both transistors 23, 24 are connected across the near end portion of the associated bit lines $5_i$. The gate of transistor 23 is connected to the output of inverter 21 and the gate of transistor 24 is connected to the output of inverter 22 to which the clock pulses are supplied from the control driver 7A. In a similar manner, the far-end balancer $3_i$ includes a driver 30 formed with a pair of cascaded inverters 31, 32, and a P-channel field-effect transistor 33 and an N-channel field-effect transistor 34. The source and drain terminals of both transistors 33, 34 are connected across the far ends of the associated bit lines $5_i$. The gate of transistor 33 is connected to the output of inverter 31 and the gate is transistor 34 is connected to the output of inverter 32 to which the clock pulses are supplied from the control driver 7B.

Figure 5:
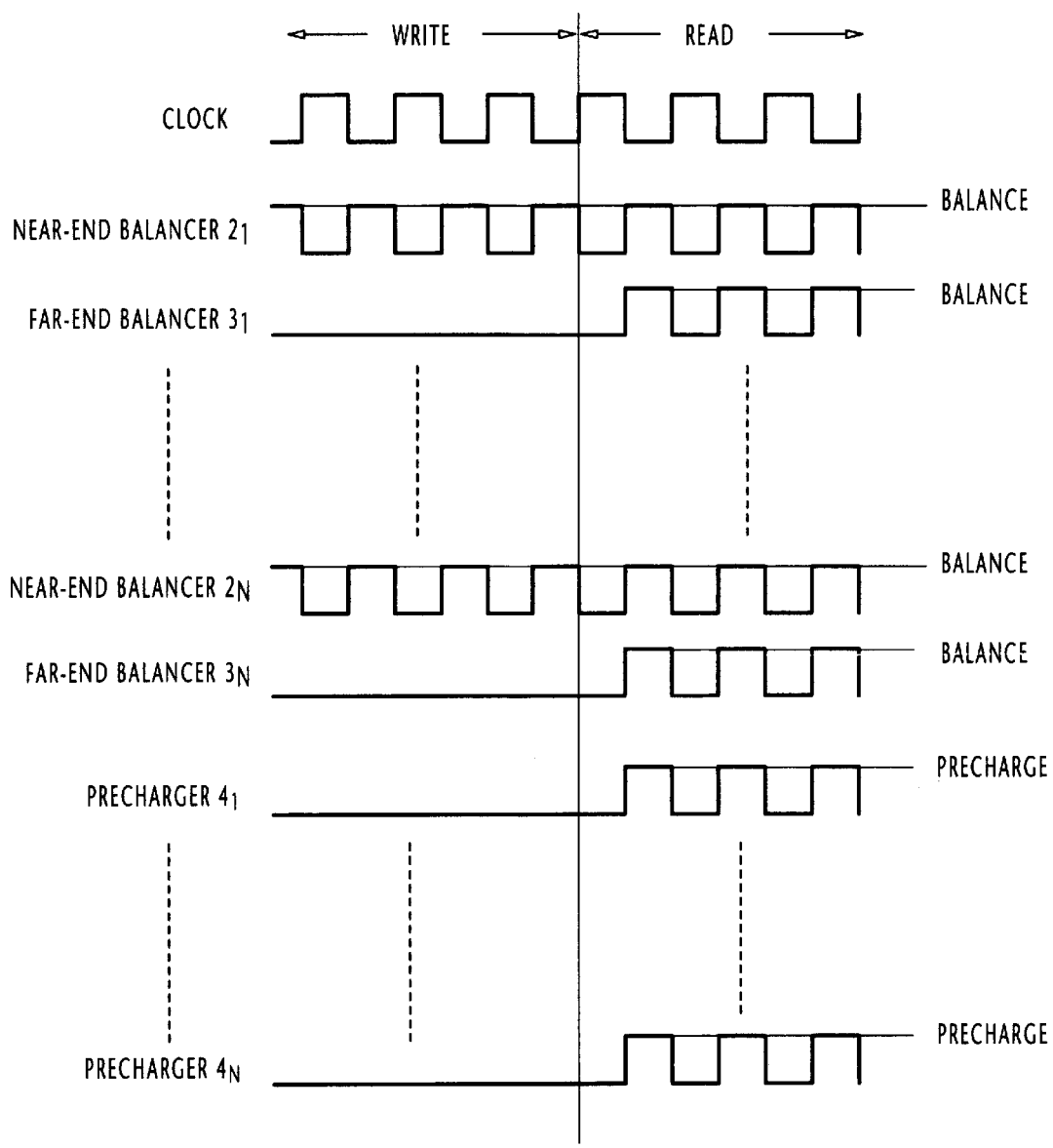
FIG. 5 is a timing diagram of the semiconductor memory of the present invention.

Precharger $4_i$ is comprised of a NOR gate 40 having a first input terminal connected to the output of the inverter 21 of the associated near-end balancer $2_i$ and a second input terminal to which is applied the same write pulse as one applied to the NOR gate 15 of the control driver 7B. The output of NOR gate 40 is connected to the gate of N-channel field-effect transistors 41 and 42 whose source-drain paths are connected to the bit lines of the corresponding pair $5_i$ for charging these bit lines with energy supplied from a voltage source. As a result, the transistors 41 and 42 are in an OFF state and hence no pre-charging action occurs during the write mode (FIG. 5). Another N-channel field-effect transistor 43 is provided in the precharger $4_i$ for compensating for the absence of balancing effect at the far end of the associated bit lines $5_i$. The source and drain of the transistor 43 are connected across the bit lines of the corresponding pair $5_i$ and the gate is connected to the output of the inverter 22 of the corresponding near-end balancer $2_i$. Transistor 43 is in an ON state during the write mode so that the bit lines $5_i$ are somewhat balanced with each other, compensating for the absence of balancing effect by the far-end balancer $3_i$.

What is claimed is:

1. A semiconductor memory comprising an array of memory cells, a plurality of bit-line pairs to which the memory cells of said array are connected, and a plurality of prechargers respectively connected to said bit-line pairs, characterized in that said prechargers are active during a read mode of the memory and remain inactive during a write mode of the memory, said semiconductor memory further characterized by a first plurality of balancers connected respectively to first ends of said bit-line pairs and a second plurality of balancers connected respectively to second, opposite ends of said bit-line pairs, wherein said first plurality of balancers are active during said read and write modes and said second plurality of balancers are active during said read mode and remain inactive during said write mode.

2. A semiconductor memory as claimed in claim 1, characterized in that each of said prechargers further includes a balancing transistor connected across the bit lines of a corresponding pair, said balancing transistor being active at least during said write mode.

3. A semiconductor memory comprising:

an array of memory cells;

a plurality of bit-line pairs to which the memory cells of said array are connected;

a plurality of precharges respectively connected to said bit-line pairs;

control circuitry for supplying energy to said precharges for charging said bit-line pairs exclusively during a read mode of said memory;

a first plurality of balancers connected respectively to first ends of said bit-line pairs; and a second plurality of balancers connected respectively to second, opposite ends of said bit-line pairs, said control circuitry supplying energy to said first plurality of balancers and said second plurality of balancers during said read mode of said memory and exclusively supplying energy to said first plurality of balancers during a write mode of said memory.

4. A semiconductor memory as claimed in claim 3, wherein each of said prechargers further includes a balancing transistor connected across the bit lines of a corresponding pair, said balancing transistor being active at least during said write mode.

5. The method of saving energy consumption of a semiconductor memory comprising an array of memory cells, a plurality of bit-line pairs to which the memory cells of said array are connected, and a plurality of precharges respectively connected to said bit-line pairs, the method comprising the step of supplying energy to said prechargers exclusively during a read mode of the memory, wherein said memory further comprises a first plurality of balancers connected respectively to first ends of said bit-line pairs, and a second plurality of balancers connected respectively to second, opposite ends of said bit-line pairs, further comprising the steps of supplying energy to said first plurality of balancers and said second plurality of balancers during said read made of said memory and exclusively supplying energy to said first plurality of balancers during a write mode of said memory.

6. The method of claim 5, further comprising the step of establishing a semiconductor path between the bit-line of each of said pairs at least during said write mode.

* * * * *